United States Patent [19]
Ambos et al.

[11] Patent Number: 4,716,362
[45] Date of Patent: Dec. 29, 1987

[54] SURFACE WAVE DISPERSIVE FILTER SPECTRUM ANALYZER

[75] Inventors: René Ambos, Morangis; Gilles Quagliaro, Chatillon; Alain Fertil, Voisin le Bretonneux, all of France

[73] Assignee: Thomson CSF, Paris, France

[21] Appl. No.: 789,952

[22] Filed: Oct. 21, 1985

[30] Foreign Application Priority Data

Oct. 30, 1984 [FR] France ................ 84 16600

[51] Int. Cl.⁴ .............................................. G01R 23/16
[52] U.S. Cl. ................................... 324/77 B; 324/79 R
[58] Field of Search ............... 364/725, 726, 826, 827; 328/14; 324/77 R, 78 R, 78 D, 79 R, 79 D

[56] References Cited

U.S. PATENT DOCUMENTS

| | | | |
|---|---|---|---|
| 3,900,721 | 8/1975 | Speiser | 364/726 |
| 4,282,579 | 8/1981 | Speiser | 364/726 |
| 4,329,651 | 5/1982 | Alsup | 328/14 |

*Primary Examiner*—Michael J. Tokar
*Attorney, Agent, or Firm*—Cushman, Darby & Cushman

[57] ABSTRACT

A surface wave dispersive filter spectrum analyzer is provided comprising two identical assemblies having "M-C-M" structure (premultiplication, convolution and post-multiplication, respectively by a first, second and third linearly frequency modulated ramps), one analyzing the signal to be analyzed, the other a reference signal, the output signal being obtained after mixing the output signals of the first and second assemblies in a mixer.

4 Claims, 3 Drawing Figures

SURFACE WAVE DISPERSIVE FILTER SPECTRUM ANALYZER

BACKGROUND OF THE INVENTION

1. Field of the Invention

The present invention relates to a surface wave dispersive filter spectrum analyzer.

Real time spectrum analyzers have undergone considerable development during these latter years among which we find entirely digital systems, or systems using analog techniques, such as surface wave dispersive filter analyzers to which the present invention relates. These latter use for example a so called "M-C-M" (multiplication-convolution-multiplication) structure, by means of which the spectrum of a signal to be analyzed is obtained by premultiplying the signal by a first linearly frequency-modulated ramp $R_1(t)$ of band B and duration T, then effecting the convolution of a signal thus obtained with the second linearly frequency-modulated ramp $R(t)$ of band 2B and duration 2T, and of a slope opposite $R_1(t)$, and by postmultiplying the signals thus obtained by a third linearly frequency-modulated ramp $R(t)$, of band B and duration T, and of a slope identical to $R_1(t)$.

These frequency ramps are advantageously obtained from the pulse response of surface wave dispersive filters.

Thus, the premultiplication ramp $R_1(t)$ is obtained by driving a first dispersive filter, called premultiplication filter, by a Dirac pulse $\delta_1(t)$. Similarly, the post multiplication ramp $R_2(t)$ is obtained by driving a second dispersive filter, called postmultiplication filter, by a Dirac pulse $\delta_2(t)$ which is initiated with a delay T with respect to pulse $\delta_1(t)$. Finally, the convolution with ramp $R(t)$ is obtained by passing through a dispersive filter, called convolution filter, having a pulse response $R(t)$.

DESCRIPTION OF THE PRIOR ART

A spectrum analyzer of this type is more especially described in the communication IX.4 by C. LARDAT, entitled "Analyseurs de spectre utilisant des filtres dispersifs à ondes de surface", in the international radar symposium of 1978 (pages 303 to 311).

The signal obtained at the output of this analyzer is a pulse whose position in time depends on the frequency F to be analyzed, and more precisely equal to $T+(F/k)$ (where K is the slope of the frequency ramps, equal to (B/T), whose amplitude is proportional to the amplitude of the spectral line of the signal to be analyzed at frequency F, and whose phase is the phase of a signal to be analyzed, at time $t=0$. This phase is further measured at a reference time $t = t_2 - (T/2)$ where $t_2$ is the time at which the demodulation pulse $\delta_2(t)$ is triggered.

In practice, these results are however not accurately checked; the phase measurement in particular comprises an error term which depends on the variations of the characteristics of the dispersive filters with the temperature and on the synchronization defects of the pulse $\delta_2(t)$ with respect to the pulse $\delta_1(t)$. In fact, when the delay in triggering pulse $\delta_2(t)$ with respect to pulse $\delta_1(t)$ is not strictly equal to T, it is no longer exact to say that the phase measurement time is time $t_2 - (T/2)$, and the phase measurement is then falsified. For the same reasons, the phase measurement is falsified when the temperature varies, for, with the parameters of the dispersive lines varying, the delay in triggering pulse $\delta_2(t)$ with respect to the pulse $\delta_1(t)$ is not strictly equal to T.

One possibility of minimizing these defects would be to deal with their cause by temperature stabilizing the analyzer, but this solution is not generally possible for reasons of volume and consumption; in addition, it does not solve the problem of the errors due to the defect in synchronizing the pulses $\delta_2(t)$ and $\delta_1(t)$.

SUMMARY OF THE INVENTION

The present invention provides a structure avoiding the phase defects related to the errors in triggering the premultiplication and post multiplication dispersive filters and to the temperature drifts of the dispersive filters, not by preventing these defects from occuring but by compensating for them exactly by identical defects generated by an identical spectrum analyzer placed under the same conditions and analyzing a reference signal which is more especially a Dirac pulse $\delta(t)$.

The surface wave dispersive filter spectrum analyzer of the invention, comprising a first "M-C-M" structure assembly, i.e. in which premultiplication, convolution and post multiplication operations are effected successively, respectively on the signal to be analyzed, on the signal obtained from the premultiplication and on the signal obtained from the convolution, by first, second and third linearly frequency-modulated ramps, this first assembly receiving the signal to be analyzed and these frequency ramps being formed by the pulse response of dispersive filters called respectively premultiplication, convolution and post multiplication filters, further comprises, on the one hand, a second "M-C-M" structure assembly identical to the first one and receiving a reference signal, the premultiplication and post multiplication dispersive filters respectively of the first and of the second assemblies receiving respectively the same control signal, and on the other hand by a mixer receiving the output signal from the first and second assemblies and supplying the output signal of the spectrum analyzer.

The present invention also provides a simplification of this latter structure consisting in making the premultiplication dispersive filter common to the two analyzers and/or in omitting the post multiplication dispersive filter of the two analyzers.

BRIEF DESCRIPTION OF THE DRAWINGS

The invention will be better understood from the following description and the accompanying Figures in which.

The elements common to these different Figures bear the same references.

DESCRIPTION OF THE PREFERRED EMBODIMENT

Figure 1:
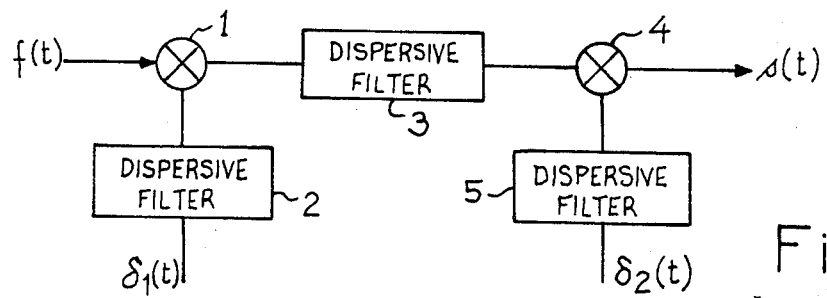
FIG. 1 is a diagram of a spectrum analyzer of the prior art.

The spectrum analyzer of the prior art shown in FIG. 1 comprises a mixer 1 which effects the premultiplication of a signal to be analyzed f(t) by a linearly frequency-modulated ramp $R_1(t)$ obtained at the output of a surface wave dispersive filter 2, of band B and duration T, driven by a Dirac pulse $\delta_1(t)$. This analyzer also comprises a surface wave dispersive filter 3, of band 2B, duration 2T and of a slope opposite $R_1(t)$ to the input of which is applied the output signal of mixer 1, and which effects the convolution of this signal by a linearly frequency-modulated ramp R(t), ramp R(t) corresponding to the pulse response of the dispersive filter 3. This analyzer finally comprises a mixer 4 which effects the post multiplication of the output signal of the dispersive filter 3 by a linearly frequency modulated ramp $R_2(t)$ obtained at the output of a surface wave dispersive filter 5, of band B and duration T, driven by a Dirac pulse $\delta_2(t)$. The output signal s(t) of this spectrum analyzer is obtained at the output of the mixer 4.

The operation of the spectrum analyzer shown in FIG. 1 will be recalled first of all.

The dispersive filter 2 is a dispersive filter of band B and duration T. It is assumed that it is triggered at time $t=-(T/2)$. The equation of the signal obtained at the output is then:

$$s_m(t) = r(t/T) \cdot e^{-i\pi k t^2}$$

where $$r(t/T) = 1 \text{ for } |(t/T)| \leq (1/2)$$

$$r(t/T) = 0 \text{ for } |(t/T)| > (1/2)$$

k = (B/T) (slope of the dispersive filter).

The dispersive filter 3 is a dispersive filter of band 2B and duration 2T. Its pulse response is:

$$s_c(t) = r\left(\frac{t-T}{2T}\right) \cdot e^{i\pi k(t-T)^2}$$

At the output of the dispersive filter 3 we obtain the following signal $$s(t) = \int_{-\infty}^{+\infty} r\left(\frac{u}{T}\right) \cdot e^{-i\pi k u^2} \cdot f(u) \cdot r\left(\frac{t-u-T}{2T}\right) \cdot e^{i\pi k(t-u-T)^2} du$$

where f(t) designates the signal to be analyzed. Now, for a time t included in the interval [(T/2), (3T/T)], we have:

$$r\left(\frac{u}{T}\right) \cdot r\left(\frac{t-u-T}{2T}\right) = r\left(\frac{u}{T}\right)$$

thus:

$$s(t) = \int_{-\frac{T}{2}}^{+\frac{T}{2}} e^{-i\pi k u^2} \cdot e^{i\pi k(t-T-u)^2} \cdot f(u) du$$

namely:

$$s(t) = \int_{-\frac{T}{2}}^{\frac{T}{2}} e^{-i\pi k u^2} \cdot e^{i\pi k(t-T)^2} \cdot e^{-2i\pi k(t-T)u} \cdot e^{ik\pi u^2} \cdot f(u) du$$

or else:

$$s(t) = e^{i\pi k(t-T)^2} \int_{-\frac{T}{2}}^{\frac{T}{2}} e^{-2i\pi k(t-T)u} \cdot f(u) du$$

s(t) can be calculated for a signal to be analyzed f(t) of the form:

$$f(t) = A e^{2i\pi f t + i\phi}$$

where $\phi$ designates the phase of the signal f(t) at time t=0. We obtain:

$$s(t) = A e^{i\phi} e^{i\pi k(t-T)^2} \cdot T \cdot \text{sinc } [\pi k(t - T(f/k)) \cdot T]$$

where "sinc" designates the cardinal sine function. To suppress the frequency modulation $\pi k(t-T)^2$ with the signal s(t) is mixed the signal from the dispersive filter 5 triggered at time $t=(T/2)$. The signal at the output of the dispersive filter 5 is:

$$s_d(t) = r(t-T/T) \cdot e^{-i\pi k(t-T)^2}$$

This filter may be chosen with the same slope as the dispersive filter 2, and in this case the sum of the phases must be found or else with the same slope as the dispersive filter 3 and in this case the difference of the phases must be found. Thus, we obtain an output signal:

$$s(t) = A \cdot e^{i\phi} \cdot T \cdot \text{sinc}\left[\pi k \left(t - T - \frac{f}{k}\right) \cdot T\right]$$

valid for t included between T/2 and 3T/2.

This is a pulse having the following characteristics:
  its position in time is T+(f/k), it is therefore a function of the frequency to be analyzed. The boundaries (T/2) and (3T/2) correspond to the frequencies $f = -(B/2)$ and $f = +(B/2)$;
  its amplitude is proportional to the amplitude of the spectral line of the input frequency (in the main lobe);
  its phase is a phase of the signal to be analyzed at time t=0 (at least in the main lobe of the cardinal sine). In fact, this phase is measured at a reference $t = t_2 - (T/2)$ where $t_2$ is the time of triggering the demodulation impulse $\delta_2(t)$ (if the system is calibrated, particularly for temperature, we have $t_2 = (T/2)$).

The diagram of FIG. 1 performs then the functions of a Fourier transformer. However, as will now be shown in greater detail, these results are somewhat falsified by the influence of the temperature. When the temperature undergoes a variation $\Delta\theta$, we have in fact the following modifications, while only considering for this calculation the single variation of the parameter T::

The slope k of the dispersive filters becomes: $k' = B/T'$ with $T' = T + 2\alpha$ (where $2\alpha = C \cdot \Delta\theta \cdot \tau$)

The coefficient C is the temperature coefficient of the dispersive filters. If they are formed on a lithium niobate substrate, we have: $C = -10^{-4}/°C$.

At this temperature, the equations of the dispersive filters 2, 3 and 5 become respectively:

$$s_m(t) = r\left(\frac{t-\alpha}{T+2\alpha}\right) \cdot e^{-i\pi k'(t-\alpha)^2}$$

-continued $$s_c(t) = r\left(\frac{t-T-2\alpha}{2T+4\alpha}\right) \cdot e^{i\pi k'(t-T-2\alpha)^2}$$

$$s_d(t) = r\left(\frac{t-T-\alpha}{T+2\alpha}\right) \cdot e^{-i\pi k'(t-T-\alpha)^2}$$

For an input signal f(t) of the form:

$$f(t) = A \cdot e^{2i\pi ft + i\phi}$$

and for a time t included in the interval:

$$[(T/2)+2\alpha, (3T/2)+4\alpha],$$

the output signal of the spectrum analyzer becomes:

$$s(t) = A \cdot e^{i\phi} \cdot e^{-2i\pi k'\alpha(t-T-\alpha)} \cdot e^{-2i\pi k'(t-T-3\alpha-\frac{f}{k'})\alpha} \cdot$$

$$(T+2\alpha) \cdot \operatorname{sinc}\pi k'\left(t-T-3\alpha-\frac{f}{k'}\right)(T+2\alpha)$$

The output signal of the spectrum analyzer has therefore been modified:
the position in time of the pulse has been shifted since it is now equal to $T+3\alpha+(f/k')$;
the presence of parasite phase terms will be noted:

$$e^{-2i\pi k'\alpha(t-T-\alpha)} \text{ and } e^{-2i\pi k'(t-T-3\alpha-(f/k'))\alpha}$$

The second term is not troublesome because, for $t = T+3\alpha+(f/k')$, that is to say at the top of the main lobe of the cardinal sine, it is zero. On the other hand, the first one corresponds to an error term affecting the phase measurement.

Figure 2:
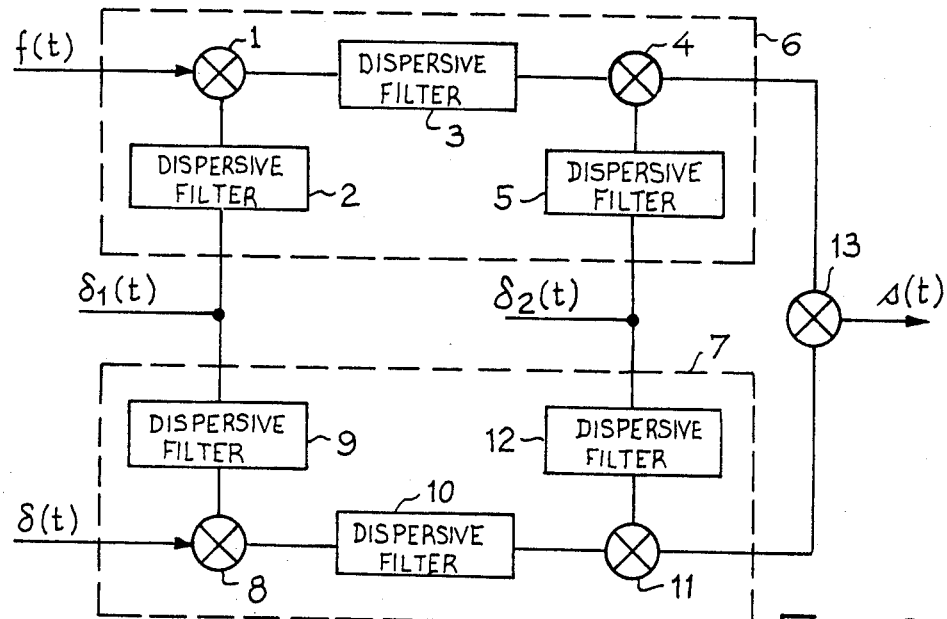
FIG. 2 is a first diagram of a spectrum analyzer in accordance with the invention.

The spectrum analyzer of the invention shown in FIG. 2 overcomes this error term. This analyzer has a differential structure obtained by means of a first spectrum analyzer 6 identical to the one shown in FIG. 1, receiving at its input the signal to be analyzed f(t), and a second spectrum analyzer 7 identical to the spectrum analyzer 6, but receiving at its input a Dirac pulse δ(t), also called reference signal. The spectrum analyzer 7 comprises, like analyzer 6, two mixers 8 and 11 and three dispersive filters 9, 10 and 12. The Dirac pulses $\delta_1(t)$ and $\delta_2(t)$ are common to the two analyzers and the output signal s(t) is obtained at the output of a mixer 13 which receives on the one hand the output signal of the first analyzer 6 and on the other the output signal of the second analyzer 7.

With such a structure, the phase error term mentioned above is differentially cancelled out. It will be noted that any input signal of analyzer 7 allows this result to be obtained, however, since only the differences between the spectrum of the signal to be analyzed f(t) and the spectrum of the input signal of analyzer 7 exist at the output of mixer 13, it is preferable to use a Dirac pulse δ(t) for the spectrum of a sufficiently narrow Dirac pulse is constant in modulus and has a zero phase.

Figure 3:
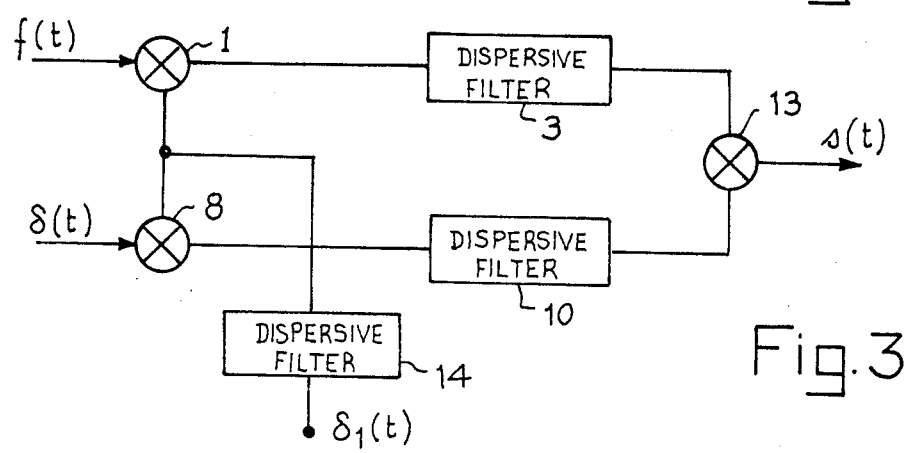
FIG. 3 is a second diagram of a spectrum analyzer in accordance with the invention.

The embodiment of the spectrum analyzer shown in FIG. 3 differs from that shown in FIG. 2 in that the dispersive modulation filters 2 and 9 are replaced by a single modulation filter 14 and in that the dispersive demodulation filters 5 and 12, as well as mixers 4 and 11 which are associated therewith, are omitted.

It will now be shown that with such a structure the phase measurement is not disturbed by temperature variations. Following the same reasoning as above, when the temperature undergoes a variation $\Delta\theta$, we have in fact the following modifications:

The slope k of the dispersive filters becomes:

$$k' = (B'/T')$$

with $$B' = B + \Delta B \text{ (where } \Delta B = -C \cdot \Delta\theta \cdot B)$$

and $$T' = T + 2\alpha \text{ (where } 2\alpha = C \cdot \Delta\theta \cdot t)$$

The pure delay β of the dispersive filters (due essentially to the transducers) becomes:

$$\beta' = \beta + \Delta\beta \text{ with } \Delta\beta = C \cdot \Delta\theta \cdot B$$

The coefficient C is the temperature coefficient of the dispersive filters. If they are formed on a lithium niobate substrate we have: $C = -10^{-4}/°C$.

At ambient temperature, we have the following equations:
for the dispersive modulation filter 14, triggered at $t = -(T/2) - \beta$:

$$s_m(t) = e^{-i\pi(2f_0 t + kt^2)} \cdot r(t/T)$$

for the dispersive convolution filter 3:

$$s_c(t) = e^{i\pi[2f_1(t-T-\beta)+k(t-T-\beta)^2]} \cdot r(t-T-\beta/2T)$$

$f_0$ and $f_1$ designate respectively the central frequency of filters 2 and 3. When the temperature undergoes a variation $\Delta\theta$, the frequencies $f_0$ and $f_1$ become respectively $f'_0 = f_0 + \Delta f_0$ and $f'_1 = f_1 + \Delta f_1$ with $\Delta f_0 = -C \cdot \Delta\theta \cdot f_0$ and $\Delta f_1 = -C \cdot \Delta\theta \cdot f_1$.

At this temperature, the equations of the dispersive modulation 14 and convolution 3 filters are written respectively:

$$s_m(t) = r\left(\frac{t - \alpha - \Delta\beta}{T + 2\alpha}\right) \cdot e^{-i\pi[2f_0(t-\alpha-\Delta\beta)+k'(t-\alpha-\Delta\beta)^2]}$$

$$s_c(t) = r\left(\frac{t - T - 2\alpha - \Delta\beta}{2T + 4\alpha}\right) \cdot$$

$$e^{i\pi[2f_1(t-T-\beta-2\alpha-\Delta\beta)+k'(t-T-2\alpha-\beta-\Delta\beta)^2]}$$

On the other hand, unlike the circuit shown in FIG. 1, the demodulation signal comes from a dispersive filter 10 with parameters (2B, 2T) trigger by a Dirac pulse centered at time t=0 and mixed with modulation signal:

$$s_d(t) = r\left(\frac{t - T - \beta - 2\alpha - \Delta\beta}{2T + 4\alpha}\right) \cdot e^{i\pi[2f_0(\alpha+\Delta\beta)-k'(\alpha+\Delta\beta)^2]} \cdot$$

$$e^{i\pi[2f_1(t-T-2\alpha-\beta-\Delta\beta)+k'(t-T-2\alpha-\beta-\Delta\beta)^2]}$$

For an input signal f(t) of the form:

$$f(t) = A \cdot e^{2i\pi f_2 t} \cdot e^{i\phi}$$

and for a time t included in the interval:

$$[(T/2)+2\alpha+\beta+\Delta\beta, (3T/2)+4\alpha+\beta+\Delta\beta]$$

we obtain at the output of the spectrum analyzer:

$$s(t) = A \cdot e^{i\phi} \cdot e^{-2i\pi k'(t-T-3\alpha-\beta-2\Delta\beta - \frac{f'}{k'})(\alpha+\Delta\beta)}$$

$$(T + 2\alpha) \cdot \operatorname{sinc}\left[\pi k'\left(t - T - 3\alpha - \beta - 2\Delta\beta - \frac{f'}{k'}\right)(T + 2\alpha)\right]$$

with $f' = f_2 - f'_0 - f'_1$ (the frequency $f_2$ of the signal to be analyzed being analyzed with respect to $f'_0 + f'_1$).

It will be noted that for the time $t = T + 3\alpha + \beta + 2\Delta\beta + (f'/k')$, i.e. at the time of the maximum of the output pulse, the phase of the signal s(t) is equal to the phase $\phi$ of the signal to be analyzed. Consequently, this structure indeed overcomes errors in the phase measurement. It has moreover, with respect to the circuit of FIG. 2, the advantage of being much simpler to construct and to use.

With the circuit shown in FIG. 2, as with that shown in FIG. 3, the phase of the output signal of the spectrum analyzer is the phase of the signal to be analyzed at time $t=0$. However, contrary to the diagram of FIG. 1, the time $t=0$ corresponds to a time reference formed by triggering the reference pulse $\delta(t)$.

What is claimed is:

1. A surface wave dispersive filter spectrum analyzer, comprising:
   a first M-C-M analyzer including:
      first dispersive filter means for receiving a first driving signal, and for delivering a first linearly frequency modulated ramp signal;
      first mixer means for receiving an input signal f(t), and for premultiplying said signal f(t) by said first ramp signal to provide a first multiplied signal;
      second dispersive filter means for convoluting said first multiplied signal with a second linearly frequency modulated ramp signal to provide a first convoluted signal;
      third dispersive filter means for receiving a second driving signal, and for delivering a second linearly frequency modulated ramp signal; and
      second mixer means for postmultiplying said first convoluted signal by said second ramp signal to provide a first analyzed signal;
   a second M-C-M analyzer including:
      fourth dispersive filter means for receiving said first driving signal, and for delivering a fourth linearly frequency modulated ramp signal;
      third mixer means for receiving a reference signal, and for premultiplying said reference signal by said fourth ramp signal to provide a second multiplied signal;
      fifth dispersive filter means for convoluting said second multiplied signal with a fifth linearly frequency modulated ramp signal to provide a second convoluted signal;
      sixth dispersive filter means for receiving said second driving signal, and for providing a sixth linearly frequency modulated ramp signal; and
      fourth mixer means for postmultiplying said second convoluted signal by said sixth ramp signal to provide a second analyzed signal; and fifth mixer means for mixing said first and second analyzed signals to provide an output signal.

2. The analyzer as claimed in claim 1, wherein said reference signal is a Dirac pulse.

3. A surface wave dispersive filter spectrum analyzer, comprising:
   first dispersive filter means for receiving a driving signal, and for delivering a first linearly frequency modulated ramp signal;
   first mixer means for receiving an input signal f(t), and for premultiplying said signal f(t) by said first ramp signal to provide a first multiplied signal;
   second mixer means for receiving a reference signal, and for premultiplying said reference signal by said first ramp signal to provide a second multiplied signal;
   second dispersive filter means for convoluting said first multiplied signal with a second linearly frequency modulated ramp signal to provide a first convoluted signal;
   third dispersive filter means for convoluting said second multiplied signal with a third linearly frequency modulated ramp signal to provide a second convoluted signal; and
   third mixer means for mixing said first and second convoluted signals to provide an output signal.

4. A surface wave dispersive filter spectrum analyzer, comprising:
   first dispersive filter means for receiving a first driving signal, and for delivering a first linearly frequency modulated ramp signal;
   first mixer means for receiving an input signal f(t), and for premultiplying said signal f(t) by said first ramp signal to provide a first multiplied signal;
   second dispersive filter means for convoluting said first multiplied signal with a second linearly frequency modulated ramp signal to provide a first convoluted signal;
   third dispersive filter means for receiving a second driving signal, and for delivering a third linearly frequency modulated ramp signal;
   second mixer means for postmultiplying said first convoluted signal by said third ramp signal to provide a first analyzed signal;
   third mixer means for receiving a reference signal, and for premultiplying said reference signal by said first ramp signal to provide a second multiplied signal;
   fourth dispersive filter means for convoluting said second multiplied signal with a fourth linearly frequency modulated ramp signal to provide a second convoluted signal;
   fifth dispersive filter means for receiving said second driving signal, and for providing a fifth linearly frequency modulated ramp signal;
   fourth mixer means for postmultiplying said second convoluted signal by said fifth ramp signal to provide a second analyzed signal; and
   fifth mixer means for mixing said first and second analyzed signals to provide an output signal.

* * * * *